United States Patent
Wu

(10) Patent No.: US 10,703,921 B2
(45) Date of Patent: Jul. 7, 2020

(54) SURFACE LAYER FOR ELECTRONIC DEVICE

(71) Applicant: XEROX CORPORATION, Norwalk, CT (US)

(72) Inventor: Jin Wu, Rochester, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 15/878,202

(22) Filed: Jan. 23, 2018

(65) Prior Publication Data
US 2019/0225815 A1 Jul. 25, 2019

(51) Int. Cl.
| | |
|---|---|
| H05K 1/18 | (2006.01) |
| C09D 5/08 | (2006.01) |
| H05K 1/03 | (2006.01) |
| H05K 3/28 | (2006.01) |
| C09D 7/63 | (2018.01) |
| G11C 11/22 | (2006.01) |

(52) U.S. Cl.
CPC .............. *C09D 5/08* (2013.01); *C09D 5/082* (2013.01); *C09D 7/63* (2018.01); *H05K 1/036* (2013.01); *H05K 1/185* (2013.01); *H05K 3/282* (2013.01); *G11C 11/22* (2013.01); *G11C 11/221* (2013.01); *H05K 2201/0104* (2013.01); *H05K 2201/015* (2013.01); *H05K 2201/0145* (2013.01); *H05K 2201/0158* (2013.01); *H05K 2201/0162* (2013.01)

(58) Field of Classification Search
CPC ... H05K 1/11; H05K 1/14; H05K 1/18; G02B 5/08; G02B 5/28; G02B 5/2852; G02B 5/0841
USPC .......................................... 361/760–764, 770
See application file for complete search history.

(56) References Cited

U.S. PATENT DOCUMENTS

| | | | |
|---|---|---|---|
| 4,743,525 A * | 5/1988 | Yamamoto ............ | G03F 7/07 430/204 |
| 5,674,377 A | 10/1997 | Sullivan, III et al. | |
| 6,618,269 B2 * | 9/2003 | Chen ..................... | H01C 7/003 361/764 |
| 7,889,509 B2 * | 2/2011 | Urashima ............. | H01G 2/06 257/723 |
| 7,894,203 B2 * | 2/2011 | Kariya ............. | H01L 23/49827 361/763 |
| 2011/0190407 A1 * | 8/2011 | Balbo Block .......... | C08J 9/0033 521/108 |
| 2011/0306729 A1 * | 12/2011 | Dreessen ............... | C08K 5/098 525/94 |

(Continued)

FOREIGN PATENT DOCUMENTS

| | | |
|---|---|---|
| CA | 2125513 A1 | 1/1995 |
| CA | 2148849 A1 | 12/1995 |
| CA | 2175847 A1 | 12/1996 |

OTHER PUBLICATIONS

Wu et al., U.S. Appl. No. 15/641,729, entitled "Memory Cells and Devices," filed Jul. 5, 2017.

*Primary Examiner* — Tuan T Dinh
(74) *Attorney, Agent, or Firm* — MH2 Technology Law Group LLP

(57) ABSTRACT

An electronic device includes a substrate and one or more electronic components positioned on the substrate. A surface layer is positioned on the electronic components, the surface layer comprising a polymer binder and a substituted or unsubstituted hexahydrotriazine compound.

18 Claims, 1 Drawing Sheet

(56) References Cited

U.S. PATENT DOCUMENTS

| | | | | |
|---|---|---|---|---|
| 2013/0118996 | A1* | 5/2013 | Kaplan | C07D 251/04 |
| | | | | 210/749 |
| 2014/0005292 | A1* | 1/2014 | Maeda | C07C 255/42 |
| | | | | 522/39 |
| 2015/0291772 | A1* | 10/2015 | Okada | C07C 69/96 |
| | | | | 544/221 |
| 2015/0307638 | A1* | 10/2015 | Nunoshige | C08F 4/52 |
| | | | | 526/75 |
| 2016/0054492 | A1* | 2/2016 | Ihara | B32B 17/10 |
| | | | | 359/359 |

* cited by examiner

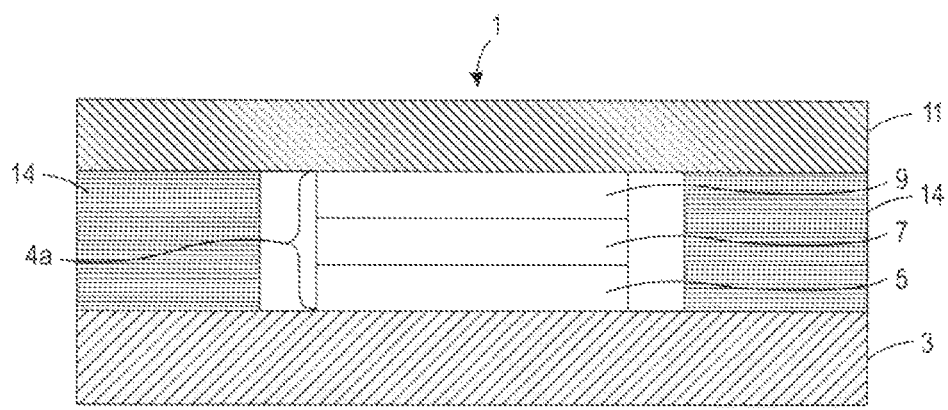

SURFACE LAYER FOR ELECTRONIC DEVICE

DETAILED DESCRIPTION

Field of the Disclosure

The present disclosure is related to a surface layer for passivating electronic devices comprising silver, and in particular, a surface layer for protecting silver from corrosion caused by exposure to sulfur containing gases.

Background

Many devices, including flexible electronic devices, employ silver as an electrical conductor. Silver conductive wiring and other components are known to be susceptible to sulfur attack, which can cause a loss of conductivity. The sulfur attack, such as from $H_2S$, or other sulfur containing gases, comes from a variety of environmental sources and/or from packaging materials for the devices. While electronic devices generally have a top packaging or other passivation layer to protect them from physical damage or wear, these layers may not fully protect them from sulfur attack.

Hexahydrotriazine is known to be an $H_2S$ scavenger used in oil and gas industries. Canadian Patent No. 2125513 discloses injecting 1,3,5-trimethyl-hexahydro-1,3,5-triazine to remove $H_2S$ from sour gases and liquid hydrocarbons. Similarly, U.S. Pat. No. 5,674,377 discloses injecting 1,3,5-tri(tert-butyl)-hexahydro-1,3,5-triazine to remove $H_2S$ from sour gases and liquid hydrocarbons, and Canadian Patent Nos. 2148849 and 2175847 disclose using 1,3,5-tri(2-hydroxylethyl)-hexahydro-1,3,5-triazine to remove $H_2S$ from sour gases and liquid hydrocarbons.

Novel materials that can be employed in layer form to protect silver conductive material in electronic devices would be a welcome addition to the art.

SUMMARY

An embodiment of the present disclosure is directed to an electronic device. The electronic device comprises a substrate and one or more electronic components positioned on the substrate. A surface layer is positioned on the electronic components, the surface layer comprising a polymer binder and a substituted or unsubstituted hexahydrotriazine compound.

A further embodiment of the present disclosure is directed to a composition for forming a surface layer on an electronic device. The composition comprises: a polymer binder precursor; a substituted or unsubstituted hexahydrotriazine compound; and optionally at least one solvent.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present disclosure.

FIG. 1 illustrates an electronic device comprising a surface layer, according to an embodiment of the present disclosure.

It should be noted that some details of the FIGURE have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

The present disclosure is directed to an electronic device. The electronic device comprises a substrate and one or more electronic components positioned on the substrate. The electronic device further includes a surface layer positioned on the electronic components. The surface layer can be positioned between the electronic components and a sulfur source, such as the atmosphere or a packaging layer containing sulfur. Thus, the surface layer can be at or near the surface of the electronic components while still being positioned under other layers of the electronic device, such as under one or more passivation layers or packaging layers. In an embodiment, the surface layer can be the outermost layer of the electronic device, as shown, for example, in FIG. 1. The surface layer comprises a polymer binder and a substituted or unsubstituted hexahydrotriazine compound. In an embodiment, the surface layer protects the underlying electronic components from corrosion by hydrogen sulfide.

The term "on" as used herein is defined so as not to require direct physical contact. Thus, for example, "one or more electronic components positioned on the substrate" can encompass both the electronic components being directly on the substrate, as well as the situation where intervening layers are formed between the substrate and the electronic components. The phrase "directly on" is defined herein to mean direct physical contact. Further, where the term "on" is used herein to describe a positional relationship, a relationship of "directly on" is also contemplated, so that each occurrence of the term "on" herein can be replaced with the phrase "directly on". Thus, it is contemplated that the electronic components can be directly on the substrate and/or that the surface layer can be positioned directly on the electronic components.

The surface layer, as described herein, can cover all or a portion of the electronic components so as to provide a desired degree of protection against corrosion from sulfur compounds. In an embodiment, the silver containing components are covered so that the outermost surface of the silver conductors are protected from corrosion (e.g., as shown for electrode 9 in FIG. 1), while other portions of the electronic device may or may not be covered. In an embodiment, the entire outer surface of the electronic device, except for exposed surfaces of the substrate, is encapsulated by the surface layer. In yet another embodiment, the entire electronic device, including the substrate, is encapsulated by the surface layer.

Substrates

The substrate can comprise any suitable material, including flexible and non-flexible materials. In an embodiment, flexible substrate materials can include those with a thermal stability of at least 70° C., such as about 100° C. to about 500° C., or about 150° C. to about 450° C., or about 200° C. to about 400° C. Examples of such materials include inorganic substrate materials such as glass, paper, or various polymers, or mixtures thereof. Examples of suitable polymers include polyesters, and more specifically MYLAR®, polyethylene terephthalate (PET: Lumirror 41.31) available from E.I. DuPont Chemical Company, polyethylene naphthalate (PEN), polytetrafluoroethylenes, such as TEFLON®, polystyrenes, polypropylenes, polyethylenes, polyvinyl chlorides, polyvinylidene chlorides, polymethyl methacrylates, polyvinyl acetates, polycarbonates, polyimides, polyamides, polyamideimides, mixtures thereof, and the like. Non-flexible substrate materials can comprise, for example, some semiconductor materials, such as silicon, germanium, compound semiconductors, such as GaAs, as well as other inorganic substrate materials such as glass. Other such flexible and non-flexible substrate materials suitable for use in the present disclosure can be determined by one of ordinary skill in the art.

The substrate can be of various effective suitable thicknesses, such as for example, from about 5 microns to about 1000 microns, from about 25 microns to about 500 microns, or from about 40 microns to about 200 microns as determined with a Permascope, and as determined by other known methods, such as an electron microscope.

Flexible refers, for example, to a material, such as the disclosed substrates, that can be bent or shaped without damage, that is capable of significant bending, such as following the curvature of a curved object, like a drum, comparatively easily and without breaking, and can be easily returned to their original shape, such as flat. Non-flexible substrates, on the other hand, are rigid and usually cannot be bent or shaped without damage, such as silicon substrates that can break or crack severely if bent.

Electronic Components

The one or more electronic components positioned on the substrate can be any electronic components for which protection against hydrogen sulfide corrosion is desired. Examples include semiconductors and electronic circuits, such as semiconductor device components, rigid and stretchable semiconductors, lighting devices such as LEDs, including organic LEDs (OLEDs), radio frequency identification (RFIDs) devices, displays such as flexible and non-flexible displays, electrophoretic displays, packaging, textiles including body suits, medical devices, sensors, solar cell panels or sheets, flexible electronic paper and other such products and devices, including devices that become available with emerging technology.

FIG. 1 illustrates an example of an electronic component on a flexible substrate. In particular, in FIG. 1 there is illustrated a memory cell 1 comprising a flexible substrate 3, which may comprise, for example, any of the flexible substrate materials disclosed herein. Memory cell 1 further comprises a first or bottom electrode 5, which can be a patterned electrode, a ferroelectric memory material layer 7, a second or top electrode 9 that can also be a patterned electrode, support spacers 14, arranged on the flexible substrate 3, adjacent opposite ends of electrically conductive component layers 4a, and a surface layer 11. Spacers 14 can, for example, be provided by commercially available strips of tape arranged parallel to the electrodes of the memory device, or by strips or dots that are printed thereon. A plurality of such memory cells can become operatively and functionally connected electrically to provide an exemplary memory device.

In an embodiment, the one or more electronic components include at least one conductive portion comprising silver.

The conductive portion can comprise either pure silver or a silver alloy. In an embodiment, the conductive portion can be an electrode or other wiring, or any conductive component of a circuit, such as a capacitor plate, inductor coil, transistor gate, device contact and so forth. As an example, referring back to FIG. 1, one or both of bottom electrode 5 and top electrode 9 can comprise silver. The silver of the electronic components of the present disclosure can be alloyed with any desired metal, such as one or more metals selected from the group consisting of copper, gold, zinc, aluminum and so forth.

The conductive portion comprising silver can have any suitable thickness. Example thicknesses can include ranges, such as from about 10 nm to about 1 micron or more, such as about 25 nanometers to about 200 nanometers, from about 50 nanometers to about 150 nanometers, from about 75 nanometers to about 125 nanometers, and from about 100 nanometers to about 110 nanometers. Other thicknesses outside of these ranges can also be employed.

Surface Layer

The surface layer comprises a substituted or unsubstituted hexahydrotriazine compound and a polymer binder. A solvent is optional, and thus may or may not be employed. The hexahydrotriazine in the surface layer functions to scavenge hydrogen sulfide gas ($H_2S$) and potentially other sulfur containing gases, thereby reducing corrosion of the underlying electrodes caused by such gas. The polymer binder acts as a carrier or binder, holding the hexahydrotriazine in place on the outer surface of the electronic device. FIG. 1 illustrates one example of the surface layer 11.

The hexahydrotriazine and polymer binder can be present in the surface layer in any suitable amounts that provide the desired scavenging of sulfur-containing gas. As an example, the hexahydrotriazine can be present in the layer in an amount of from about 0.01 to about 20 weight percent, or from about 0.1 to about 15 weight percent, or from about 1 to about 10 weight percent of the total layer solids. The polymer can be present in an amount of from about 80 to about 99.99 weight percent, or from about 85 to about 99.9 weight percent, or from about 90 to about 99 weight percent of the total layer solids.

The thickness of the surface layer after curing can be any suitable thickness. For example, the thickness can range from about 1 micron to about 300 microns, from about 5 microns to about 100 microns, or from about 6 microns to about 50 microns, as measured with an electron microscope.

Any suitable substituted or unsubstituted hexahydrotriazine compound that is capable of scavenging hydrogen sulfide gas can be employed in the surface layer. In an embodiment, the substituted or unsubstituted hexahydrotriazine compound is a compound having a general formula I,

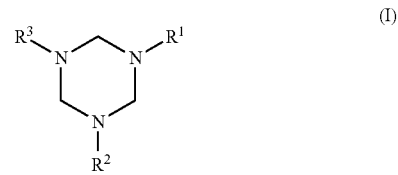

where $R^1$, $R^2$ and $R^3$ are independently selected from any of the groups consisting of a hydrogen radical; alkyl groups, such as $C_1$ to $C_{10}$ alkyl groups like methyl, ethyl, propyl and butyl; aryl groups, such as phenyl, benzyl, tolyl and naphthyl groups; and —ROH groups, where R is an alkyl group, such as a $C_1$ to $C_8$, or $C_1$ to $C_4$ alkyl. Any $R^1$, $R^2$ and $R^3$ groups can potentially be chosen that will allow the hexahydrotriazine compound to scavenge hydrogen sulfide and that are compatible with the polymer binder.

Examples of such hexahydrotriazine compounds may include 1,3,5-trimethyl-hexahydro-1,3,5-triazine, 1,3,5-tri(tert-butyl)-hexahydro-1,3,5-triazine, 1,3,5-tri(2-hydroxyl-ethyl)-hexahydro-1,3,5-triazine, 1,3,5-triethyl-hexahydro-1,3,5-triazine, 1,3,5-tribenzyl-hexahydro-1,3,5-triazine, and mixtures thereof.

The polymer binder employed to form the surface layer can be any polymer that provides a suitable matrix material and that will allow the hexahydrotriazine to contact and scavenge hydrogen sulfide gas. In an embodiment, the polymer binder is selected from the group consisting of UV curable polymers, thermally curable polymers, electron beam curable polymers and combinations thereof.

An example of a UV curable polymer that is suitable as a binder is a crosslinked mixture of i) a polyether-modified acrylate oligomer, ii) a polyester acrylic resin, iii) a component selected from the group consisting of a silicone acrylate oligomer, a fluorinated acrylate oligomer and mixture thereof, and iv) a photoinitiator. The amount of polymer binder precursors can be in a weight ratio of the polyether-modified acrylate oligomer, the polyester acrylic resin, the silicone acrylate oligomer and/or fluorinated acrylate oligomer, and the photoinitiator of, for example, from about 47/47/2/4, about 42/52/2/4, about 30/62/4/4, about 40/55/2/3, about 45/50/2/3, about 47/48/3/2, about 48/49/1/2. Other effective ratios can also be employed. In an embodiment, the weight ratio of the polyether-modified acrylate oligomer to the polyester acrylic resin ranges from about 1:1 to about 1:2, where the polyether-modified acrylate oligomer and the polyester acrylic resin make up more than 90% by weight of the total weight of the polymer binder precursors (e.g. the total weight of the polyether-modified acrylate oligomer, the polyester acrylic resin, the silicone acrylate oligomer, the fluorinated acrylate oligomer and the photoinitiator).

Examples of polyether-modified acrylate oligomers included in the surface layer mixture are ethoxylated trimethylolpropane triacrylates as represented, for example, by the following formula/structure

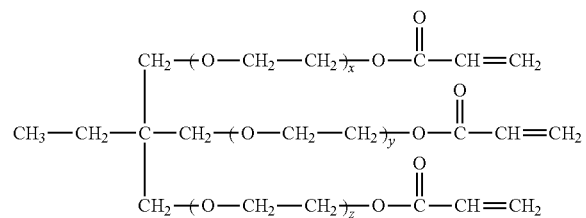

where x is from about 1 to about 10, y is from about 1 to about 10, z is from about 1 to about 10, and the sum of x+y+z is from about 3 to about 24. Other example ranges include wherein x is from about 1 to about 6, y is from about 1 to about 6, z is from about 1 to about 6, and the sum of x+y+z is from about 3 to about 16, or wherein x is 2, y is 2 and z is 2.

Examples of commercially available polyether-modified acrylate oligomers include LAROMER® LR 8863 (molar mass=530 g/mol) available from BASF Corporation, LAROMER® PO94F available from BASF Corporation, SR502 (molar mass=692 g/mol) available from Sartomer Americas of Pennsylvania, and SR415, available from Sartomer Americas of Pennsylvania. Other examples of known polyether-modified acrylate oligomers include the oligomers disclosed in U.S. Pat. No. 7,858,279, the disclosure of which is incorporated herein by reference in its entirety.

The LAROMER® LR 8863 is believed to possess the following formula/structure

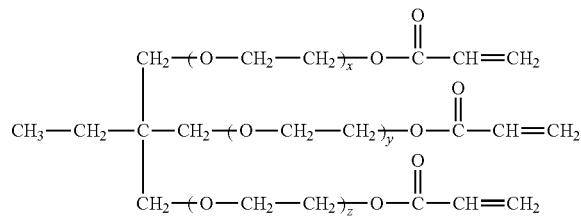

wherein x is 2, y is 2, and z is 2.

Any suitable polyester acrylic resins can be employed to form the binder. Polyester acrylic resin examples include, for example, those with a viscosity at 23° C. of from about 10,000 cps to about 200,000 cps, or from about 20,000 cps to about 100,000 cps, such as LAROMER® PE 9079 (reported viscosity at 23° C. of 78,500 cps), LAROMER® PE55F, available from BASF Corporation, and B-501M, available from Guangzhou Bossin Chemical Technology Company.

Any suitable silicone acrylate oligomers can be employed to form the binder. Examples of silicone acrylate oligomers include siliconized urethane acrylate oligomers, such as CN990 (functionality=2, $T_g$=−37° C., surface tension=22 dyne/cm, viscosity at 60° C.=1,820 cps), available from Sartomer Americas (Sartomer USA, LLC); difunctional silicone urethane acrylate oligomers; aliphatic silicone acrylate oligomers, such as CN9800 (functionality=2, $T_g$=−19° C., surface tension=21 dyne/cm), available from Sartomer Americas (Sartomer USA, LLC); difunctional aliphatic silicone acrylate oligomers available from Sartomer Americas (Sartomer USA, LLC).

Any suitable fluorinated acrylate oligomers can be employed to form the binder. Fluorinated acrylate oligomer examples include polyfluoropolyether urethane acrylates, such as FLUOROLINK®AD1700 (functionality=4, fluoro content=24 weight percent) available from Solvay Chemicals, and believed to be represented by the following structure

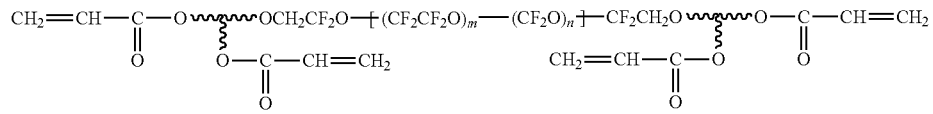

where m is from 1 to about 25, from 1 to about 15, from 1 to about 10, or from 1 to about 5; n is from 1 to about 25, from 1 to about 15, from 1 to about 10, or from 1 to about 5. Another example of suitable fluorinated acrylate oligomers is Sartomer CN4000, available from Sartomer Americas.

Any suitable photoinitiators can be employed to form the binder. Examples of photoinitiators, which can be employed to initiate the polymerization of monomers and oligomers with UV irradiation, include those illustrated in U.S. Pat. No. 8,338,536, assigned to Henkel Corporation, the disclosure of which patent is incorporated herein by reference in its entirety. Other examples of photoinitiators are taught in U.S. Patent Publication 20090298970, based on WO Publication 2008085286A1, the disclosures of both of which publications are incorporated herein by reference in their entireties. Other photoinitiator examples include those available from IGM Resins, BASF, and Sartomer, Americas Inc., Exton, Pa. as ESACURE® and SARCAT®, such as ESACURE® KB1 (benzil dimethyl ketal), ESACURE® EB3 (a mixture of benzoin and butyl ethers), ESACURE® TZT (a trimethylbenzophenone blend), ESACURE® KIP100F (hydroxy ketone), ESACURE® KIP150 (a polymeric hydroxy ketone), ESACURE® KT37 (a blend of ESACURE® TZT and KIP150), ESACURE® KT046 (a blend of triphenyl phosphine oxide, ESACURE® KIP150 and ESACURE® TZT), ESACURE® X33 [a blend of 2- and 4-isopropylthioxanthone, ethyl 4-(dimethyl amino) benzoate and ESACURE® TZT]; SARCAT® CD 1010 [triaryl sulfonium hexafluoroantimonate (50 percent in propylene carbonate)], SARCAT® DC 1011 [triaryl sulfonium hexafluorophosphate (50 percent n-propylene carbonate)], SARCAT® DC 1012 (diaryl iodonium hexafluoroantimonate), SARCAT® K185 [triaryl sulfonium hexafluorophosphate (50 percent in propylene carbonate)], and LUCIRIN® TPO-L (ethyl-2,4,6 trimethylbenzoylphenyl phosphinate) available from BASF Chemicals, optionally mixtures thereof, and the like.

The surface layer may also include additional optional ingredients, such as diacrylate reactive components such as a hexanediol diacrylate, a tripropyleneglycol diacrylate, a dipropyleneglycol diacrylate, mixtures thereof, and the like in amounts, for example, of from about 0.1 weight percent to about 30 weight percent, such as 1 to about 25 weight percent, or about 2 to about 20 weight percent, based on the total weight of the solids content in the layer.

Additionally, the surface layer composition may optionally include an amine synergist present in an amount of from about 0.01 to about 5 weight percent, such as about 0.1 weight percent to about 2 weight percent, or 0.1 weight percent to about 1 weight percent, based on the total weight of the solids content in the layer. Examples of suitable amine synergists include low molecular weight tertiary amine compounds and/or acrylated amines, which primarily function to increase reactivity. The amine synergist may be, for example, triethanol amine and/or methyl diethanol amine. Other ingredients that can optionally be employed in the surface layer compositions of the present disclosure include those selected from the group consisting of surface leveling agents, such as silicone or fluoropolymer based leveling agents, catalysts and combinations thereof.

Further, the composition deposited to form the surface layer can optionally be diluted with one or more solvents, such as esters, ketones, or aromatic hydrocarbons. The one or more solvents can be completely removed, substantially completely removed (e.g., less than 2% by weight solvent remains in the composition based on the total weight of the solids content of the composition) or partially removed from the composition by any suitable techniques, such as where the solvents are flashed off from the coating prior to curing. In an alternative embodiment, no solvents are employed.

Curing of the UV curable polymers is accomplished using any suitable UV curing techniques. Ultraviolet curing (UV curing) has been described as a photochemical process where UV light, either in addition to or in place of heat (e.g., at room temperature, such as 25° C.), is employed to cure. Any suitable UV light source can be employed. Thus, the surface layer mixtures disclosed herein can be subjected to UV energy from, for example, mercury vapor lamps, fluorescent lamps, LED sources, and the like. For instance, the disclosed surface layer mixture can be cured with a XENON® UV lamp at, for example, a pulse rate of up to about 100 pulses per second and with up to about 507 J/s energy.

The amount of crosslinking ranges for each of the disclosed coating mixture components can vary, and depends, for example, on many factors, such as the crosslinking percentage desired. The crosslinking percentage of the surface layer mixture subsequent to curing can be, for example, from about 40 percent to about 100 percent, from about 50 percent to about 99 percent, from about 70 percent to about 95 or any other desired amounts. The crosslinking percentages described herein are determined by Fourier Transform Infrared (FTIR) Spectroscopy. The above described UV curable polymers may also be cured by electron beam radiation, either in addition to or in place of a UV radiation source.

In place of the UV curing polymer systems described herein above, the surface layer can comprise other polymers, such as polymers cured by heating. Examples of thermally curable polymers include polyurethanes, phenolic resins, aminoplast resins, and the like, and mixtures thereof.

Suitable polyurethanes can be derived from suitable polymer binder precursors, such as mixtures of polyacrylates and isocyanates (e.g., such as diisocyanates, polyisocyanates). For example, suitable polyurethanes can include, but are not limited to, reaction products of polyaspartic acid ester and isocyanate ("2K urethane"); reaction products of hydroxy-functional polyacrylates and isocyanate; and the like, and combinations thereof. Commercially available examples of polyacrylates include Desmophen® NH 1120 and Desmophen® A 450 BA (Bayer Material Science AG of Leverkusen, Germany). Commercially available examples of isocyanates include Desmodur® BL 3175A (Bayer Material Science AG of Leverkusen, Germany).

Suitable phenolic resins refer to condensation products of an aldehyde with a phenol source in the presence of an acidic or basic catalyst.

The phenol source can be, for example, phenol, alkyl-substituted phenols such as cresols and xylenols; halogen-substituted phenols such as chlorophenol; polyhydric phenols such as resorcinol or pyrocatechol; polycyclic phenols such as naphthol and bisphenol A; aryl-substituted phenols; cyclo-alkyl-substituted phenols; aryloxy-substituted phenols; and the like, and combinations thereof. In various aspects, the phenol source can be phenol, 2,6-xylenol, o-cresol, p-cresol, 3,5-xylenol, 3,4-xylenol, 2,3,4-trimethyl phenol, 3-ethyl phenol, 3,5-diethyl phenol, p-butyl phenol, 3,5-dibutyl phenol, p-amyl phenol, p-cyclohexyl phenol, p-octyl phenol, 3,5-dicyclohexyl phenol, p-phenyl phenol, p-crotyl phenol, 3,5-dimethoxy phenol, 3,4,5-trimethoxy phenol, p-ethoxy phenol, p-butoxy phenol, 3-methyl-4-methoxy phenol, p-phenoxy phenol, multiple ring phenols such as bisphenol A, and combinations thereof.

The aldehyde for use in making the phenolic resin can be, for example, formaldehyde, paraformaldehyde, acetaldehyde, butyraldehyde, paraldehyde, glyoxal, furfuraldehyde, propionaldehyde, benzaldehyde, and combinations thereof. In various aspects, the aldehyde can be formaldehyde.

Non-limiting examples of phenolic resins include dicyclopentadiene type phenolic resins, phenol novolak resins, cresol novolak resins, phenol aralkyl resins, and combinations thereof. Other non-limiting examples of phenolic resins include alcohol-soluble resol-type phenolic resins such as PHENOLOTE® J-325 (DIC Corp. of Tokyo, Japan); formaldehyde polymers with phenol, p-tert-butylphenol, and cresol, such as VARCUM™ 29159 and 29101 (OxyChem Co.) and DURITE® 97 (Borden Chemical); or formaldehyde polymers with ammonia, cresol, and phenol, such as VARCUM® 29112 (OxyChem Co.); or formaldehyde polymers with 4,4'-(1-methylethylidene) bisphenol such as VARCUM® 29108 and 29116 (OxyChem Co.); or formaldehyde polymers with cresol and phenol such as VARCUM™ 29457 (OxyChem Co.), DURITE® SD-423A, SD-422A (Borden Chemical); or formaldehyde polymers with phenol and p-tert-butylphenol such as DURITE® ESD 556C (Borden Chemical).

In aspects, the phenolic resins can be used as-is or they can be modified. For example, the phenolic resins can be modified with suitable plasticizers, e.g. including but not limited to polyvinyl butyral, nylon resins, thermoset acrylic resins, polyvinyl formal, alkyds, epoxy resins, phenoxy resins (bisphenol A, epichlorohydrin polymer, and the like), polyamides, polyacrylates, oils, and the like, and combinations thereof. Various modifiers are known under various trade names, including but not limited to DESMOPHEN®, DESMODUR®, BUTVAR®, ELVAMIDE®, DORESCO®, SILCLEAN®, and PARALOID®.

Suitable aminoplast resins refer to amino resins made from a nitrogen-containing substance and formaldehyde, wherein the nitrogen-containing substance includes melamine, urea, benzoguanamine, and glycoluril. The aminoplast resins can be highly alkylated or partially alkylated. In aspects, the aminoplast resins can be used as-is or they can be modified. For example, the aminoplast resins can be modified with suitable plasticizers, e.g. including but not limited to polyvinyl butyral, nylon resins, thermoset acrylic resins, polyvinyl formal, alkyds, epoxy resins, phenoxy resins (bisphenol A, epichlorohydrin polymer, and the like), polyamides, polyacrylates, oils, and the like, and combinations thereof. Various modifiers are known under various trade names, including but not limited to DESMOPHEN®, DESMODUR®, BUTVAR®, ELVAMIDE®, DORESCO®, SILCLEAN®, and PARALOID®.

If melamine is used, the resulting resin is also known as a "melamine resin". Melamine resins are known under various trade names, including but not limited to CYMEL®, BEETLE®, DYNOMIN®, BECKAMINE®, UFR®, BAKELITE®, ISOMIN®, MELAICAR®, MELBRITE®, MELMEX®, MELOPAS®, RESART®, and ULTRAPAS®.

In aspects, the melamine resin can have a generic formula of

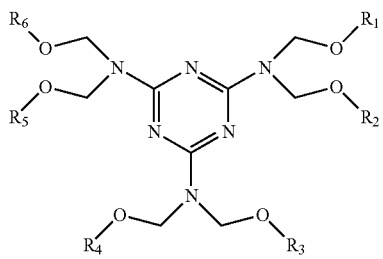

in which $R_1$, $R_2$, $R_3$, $R_4$, $R_5$ and $R_6$ each independently represents a hydrogen atom or an alkyl chain with 1 to 8 carbon atoms, or with 1 to 4 carbon atoms.

The melamine resin can be water-soluble, dispersible or indispersible. In various aspects, the melamine resin can be highly alkylated/alkoxylated, partially alkylated/alkoxylated, or mixed alkylated/alkoxylated. In various aspects, the melamine resin can be methylated, n-butylated or isobutylated. In other aspects, the melamine resin can have low methylol and high imino content. In embodiments, the melamine resin can be described as oligomeric in nature with methoxymethyl and imino main functionalities. Non-limiting examples of the melamine resin can include methylated high imino melamine resins (partially methylolated and highly alkylated) such as CYMEL® 323, 325, 327, 328, 385; highly methylated melamine resins such as CYMEL® 350, 9370; partially methylated melamine resins (highly methylolated and partially methylated) such as CYMEL® 373, 370; high solids mixed ether melamine resins such as CYMEL® 1130, 324; n-butylated melamine resins such as CYMEL™ 1151, 615; n-butylated high imino melamine resins such as CYMEL® 1158; iso-butylated melamine resins such as CYMEL® 255-10. CYMEL® melamine resins are commercially available from Cytec Industries Inc. of Woodland Park, N.J.

In aspects, the melamine resin can be selected from methylated formaldehyde-melamine resin, methoxymethylated melamine resin, ethoxymethylated melamine resin, propoxymethylated melamine resin, butoxymethylated melamine resin, hexamethylol melamine resin, alkoxyalkylated melamine resins such as methoxymethylated melamine resin, ethoxymethylated melamine resin, propoxymethylated melamine resin, butoxymethylated melamine resin, and mixtures thereof.

If urea is used, the resulting resin is also known as a "urea resin". Urea resins are known under various trade names, including but not limited to CYMEL®, BEETLE®, DYNOMIN®, BECKAMINE® and AMIREME®.

In aspects, the urea resin can have a generic formula of

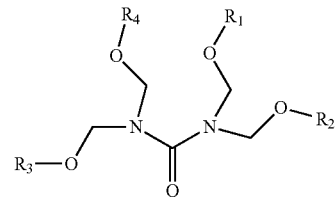

in which $R_1$, $R_2$, $R_3$, and $R_4$ each independently represents a hydrogen atom or an alkyl chain with 1 to 8 carbon atoms, or with 1 to 4 carbon atoms.

In aspects, the urea resin can be water-soluble, dispersible or indispersible. In various aspects, the urea resin can be highly alkylated/alkoxylated, partially alkylated/alkoxylated, or mixed alkylated/alkoxylated. In various aspects, the urea resin can be methylated, n-butylated or isobutylated. Non-limiting examples of the urea resin include methylated urea resins such as CYMEL® U-65, U-382; n-butylated urea resins such as CYMEL® U-1054, UB-30-B; iso-butylated urea resins such as CYMEL® U-662, UI-19-I. CYMEL® urea resins are commercially available from Cytec Industries Inc. of Woodland Park, N.J.

If benzoguanamine is used, the resulting resin is also known as a "benzoguanamine resin". Benzoguanamine resins are known under various trade names, including but not limited to CYMEL®, BEETLE® and UFORMITE®.

In aspects, the benzoguanamine resin can have a generic formula of

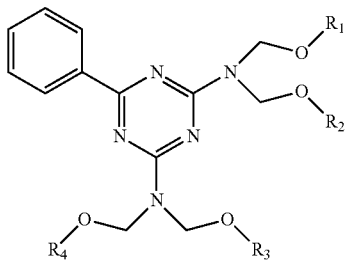

in which $R_1$, $R_2$, $R_3$, and $R_4$ each independently represents a hydrogen atom or an alkyl chain with 1 to 8 carbon atoms, or with 1 to 4 carbon atoms.

The benzoguanamine resin can be water-soluble, dispersible or indispersible. In various aspects, the benzoguanamine resin can be highly alkylated/alkoxylated, partially alkylated/alkoxylated, or mixed alkylated/alkoxylated. In various aspects, the benzoguanamine resin can be methylated, n-butylated or isobutylated. Non-limiting examples of the benzoguanamine resin include CYMEL™ 659, 5010, 5011. CYMEL® benzoguanamine resins are commercially available from Cytec Industries Inc. of Woodland Park, N.J.

If glycouracil is used, the resulting resin is also known as a "glycoluril resin". Glycoluril resins are known under various trade names, including but not limited to CYMEL® and POWDERLINK®.

In aspects, the glycoluril resin can have a generic formula of

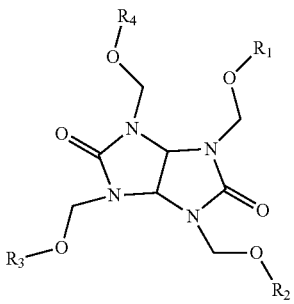

in which $R_1$, $R_2$, $R_3$, and $R_4$ each independently represents a hydrogen atom or an alkyl chain with 1 to 8 carbon atoms, or with 1 to 4 carbon atoms.

The glycoluril resin can be water-soluble, dispersible or indispersible. In various aspects, the glycoluril resin can be highly alkylated/alkoxylated, partially alkylated/alkoxylated, or mixed alkylated/alkoxylated. In various aspects, the glycoluril resin can be methylated, n-butylated or isobutylated. Non-limiting examples of the glycoluril resin include CYMEL® 1170, 1171. CYMEL® glycoluril resins are commercially available from Cytec Industries Inc. of Woodland Park, N.J.

Catalysts can be incorporated into these thermally curable polymers to accelerate the crosslinking reactions. Catalyst examples selected for the disclosed mixtures include p-toluene sulfonic acid (p-TSA) and their blocked forms, such as CYCAT® 4040, CYCAT® 4045, both available from Allnex Belgium SA/NV; K-CURE® 1040; K-CURE® 1040W, NACURE® XP-357 (a blocked p-toluene sulfonic acid in methanol with a pH of 2 to 4, a dissociation temperature of about 65° C.), 2107, 2500, 2501, 2522, 2530, 2547, 2558, all available from King Industries, Inc., Science Road, Conn.; dinonyl naphthalene disulfonic acid (DNNDSA), and their blocked forms, such as CYCAT® 500, all available from Allnex Belgium SA/NV; NACURE® 155, X49-110, 3525, 3327, 3483, all available from King Industries, Inc., Science Road, Conn.; dinonyl naphthalene sulfonic acid (DNNSA) types and their blocked forms, such as NACURE® 1051, 1323, 1419, 1557, 1953, all available from King Industries, Inc., Science Road, Conn.; dodecylbenzenesulfonic acid (DDBSA) and their blocked forms such as CYCAT® 600, available from Allnex Belgium SA/NV, and NACURE® 5076, 5225, 5414, 5528, 5925, all available from King Industries, Inc., Science Road, Conn.; acid phosphates, and their blocked forms such as CYCAT® 296-9, available from Allnex Belgium SA/NV, and NACURE® 4054, XC-C207, 4167, XP-297, 4575, all available from King Industries, Inc., Science Road, Conn.

Specific examples of acid catalysts selected to assist in the curing process and to accelerate the disclosed mixture crosslinking reaction include p-toluene sulfonic acid (p-TSA), dinonyl naphthalene disulfonic acid (DNNDSA), dinonyl naphthalene sulfonic acid (DNNSA), dodecylbenzenesulfonic acid (DDBSA), alkyl acid phosphates, phenyl acid phosphates, oxalic acid, maleic acid, carbolic acid, ascorbic acid, malonic acid, succinic acid, tartaric acid, citric acid, methane sulfonic acid, and mixtures thereof. The catalysts for the surface layer are selected in various effective amounts, such as for example, from about 0.1 to about 10 weight percent, from about 0.2 to about 5 weight percent, and from about 0.5 to about 3 weight percent based on the solids present.

Leveling agents may be optionally incorporated in the disclosed thermally curable mixtures. Examples of the leveling agents, which can contribute to the smoothness characteristics, such as enabling smooth coating surfaces with minimal or no blemishes or protrusions, of the members illustrated herein include polysiloxane polymers, known suitable fluoropolymers, and mixtures thereof. The optional polysiloxane polymers include, for example, a polyester modified polydimethylsiloxane with the trade name of BYK® 310 (about 25 weight percent in xylene) and BYK® 370 (about 25 weight percent in xylene/alkylbenzenes/cyclohexanone/monophenylglycol=75/11/7/7); a polyether modified polydimethylsiloxane with the trade name of BYK® 333, BYK® 330 (about 51 weight percent in methoxypropylacetate) and BYK® 344 (about 52.3 weight percent in xylene/isobutanol=80/20), BYK®-SILCLEAN 3710 and 3720 (about 25 weight percent in methoxypropanol); a polyacrylate modified polydimethylsiloxane with the trade name of BYK®-SILCLEAN 3700 (about 25 weight percent in methoxypropylacetate); or a polyester polyether modified polydimethylsiloxane with the trade name of BYK® 375 (about 25 weight percent in di-propylene glycol monomethyl ether), all commercially available from BYK Chemical. The leveling agents for the surface layer are selected in various effective amounts, such as for example, from about 0.01 to about 5 weight percent, from about 0.1 to about 3 weight percent, and from about 0.2 to about 1 weight percent based on the solids present.

Subsequent to curing of the disclosed coating mixture in the presence of a catalyst and an optional leveling agent, which curing can be accomplished quickly, such as for example, from about 5 to about 60 minutes, from about 10 to about 45 minutes, and more specifically, about 10 minutes, there results a crosslinked polymer product. The curing can be accomplished by heating at temperatures equal to, or exceeding about 80° C. for extended time periods. More specifically, the curing of the disclosed mixture, in the presence of a catalyst, can be completed at various suitable temperatures, such as for example, from about 60° C. to about 220° C., from about 80° C. to about 180° C., or from about 100° C. to about 140° C. for a period of, for example, from about 1 to about 40 minutes, from about 3 to about 30 minutes, from about 5 to about 20 minutes, from about 10 to about 15 minutes, and yet more specifically, wherein the curing, or drying time is from about 5 to about 10 minutes.

Any suitable methods can be employed for mixing and coating the compositions used to form the surface layers of the present disclosure. In an embodiment, a polymer binder precursor, substituted or unsubstituted hexahydrotriazine compound; and optionally at least one solvent can be mixed in any suitable amounts to produce the composition for forming the surface layer. As an example, any of the hexahydrotriazine compounds described herein can be present in the compositions in an amount of from about 0.01 to about 20 weight percent, or from about 0.1 to about 15 weight percent, or from about 1 to about 10 weight percent, based on the total weight of solids in the composition. As an example, any of the polymer binder precursors (e.g., materials described above for the UV curable, electron beam curable polymers and thermally cured polymers), described herein can be present in an amount of from about 80 to about 99.99 weight percent, or from about 85 to about 99.9 weight percent, or from about 90 to about 99 weight percent, based on the total weight of solids in the composition. If the solvent is present in the surface layer coating solution, any of the solvents described herein can be employed, and the solid content of the solution can be, for example, from about 5 to about 99 weight percent, or from about 10 to about 70 weight percent, or from about 20 to about 50 weight percent. In an embodiment, a solvent is not present in the coating compositions. Examples of suitable coating methods for depositing the compositions include, for example, liquid coating methods, screen coating, printing methods, such as inkjet printing, roll-to-roll processing and so forth. One of ordinary skill in the art would readily be able to determine suitable mixing and coating techniques for applying the surface layer compositions of the present disclosure. After coating, the composition can be dried and/or cured. For example, curing can be accomplished by any of the techniques described herein.

The present disclosure is also directed to a method of protecting an electronic device from corrosion due to exposure to hydrogen sulfide or other sulfur containing compounds. The method comprises providing a substrate comprising one or more electronic components positioned thereon. A surface layer, such as any of the surface layers described herein, is formed on the substrate. The surface layer comprises a polymer binder and a substituted or unsubstituted hexahydrotriazine compound. In the event the electronic device is exposed to a sulfur containing compound, such as $H_2S$, the surface layer can act to scavenge the sulfur containing compound, thereby reducing or preventing corrosion of underlying electrodes or other conductors comprising silver, as described herein.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including", "includes", "having", "has", "with" or variants thereof are used in either the detailed description and the claims, such terms are intended to be inclusive in a manner similar to the term "comprising". Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. An electronic device, comprising:
a substrate;
one or more electronic components positioned on the substrate; and
a surface layer positioned on the one or more electronic components, the surface layer comprising a polymer binder and a substituted or unsubstituted hexahydrotriazine compound having a general formula I:

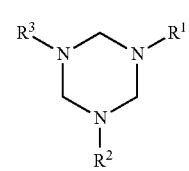

where $R^1$, $R^2$ and $R^3$ are independently selected from the group consisting of a hydrogen radical, alkyl group, aryl group, or —ROH, where R is an alkyl group, and wherein the substituted or unsubstituted hexahydrotriazine compound is present in an amount of from about 0.01 to about 20 weight percent, based on the total weight of surface layer solids; and the polymer binder precursor is present in an amount of from about 80 to about 99.99 weight percent, based on the total weight of surface layer solids.

2. The electronic device of claim 1, wherein the substrate comprises a material selected from the group consisting of paper, glass, semiconductor, a polymer and combinations thereof.

3. The electronic device of claim 1, wherein the one or more electronic components comprise at least one conductive portion comprising silver.

4. The electronic device of claim 1, wherein the polymer binder comprises a polymer selected from the group consisting of UV curable polymers, thermally curable polymers, electron beam curable polymers and combinations thereof.

5. The electronic device of claim 1, wherein the polymer binder comprises a crosslinked mixture of i) a polyether-modified acrylate oligomer, ii) a polyester acrylic resin, iii) a component selected from the group consisting of a silicone acrylate oligomer, a fluorinated acrylate oligomer and mixture thereof, and iv) a photoinitiator.

6. The electronic device of claim 1, wherein the polymer binder comprises a crosslinked polymer selected from the group consisting of a polyurethane, a phenolic resin, an aminoplast resin, and mixtures thereof.

7. The electronic device of claim 1, wherein the substituted or unsubstituted hexahydrotriazine compound is selected from the group consisting of 1,3,5-trimethyl-hexahydro-1,3,5-triazine, 1,3,5-tri(tert-butyl)-hexahydro-1,3,5-triazine, 1,3,5-tri(2-hydroxylethyl)-hexahydro-1,3,5-triazine, 1,3,5-triethyl-hexahydro-1,3,5-triazine, 1,3,5-tribenzyl-hexahydro-1,3,5-triazine and mixtures thereof.

8. The electronic device of claim 1, wherein the surface layer comprises one or more optional ingredients selected from the group consisting of a diacrylate reactive component, an amine synergist, a surface leveling agent, a catalyst and combinations thereof.

9. The electronic device of claim 1, wherein the polymer binder comprises a crosslinked polymer selected from the group consisting of i) a mixture of polyacrylates and isocyanates; ii) a phenolic resin, an iii) aminoplast resin, and combinations thereof.

10. The electronic device of claim 2, wherein the polymer is selected from the group consisting of polyesters, polyethylene terephthalate, polyethylene naphthalate (PEN), polytetrafluoroethylenes, polystyrenes, polypropylenes, polyethylenes, polyvinyl chlorides, polyvinylidene chlorides, polymethyl methacrylates, polyvinyl acetates, polycarbonates, polyimides, polyamides, polyamideimides and combinations thereof.

11. The electronic device of claim 3, wherein the silver is selected from the group consisting of pure silver and a silver alloy.

12. The electronic device of claim 11, wherein the silver alloy comprises silver and one or more metals selected from the group consisting of copper, gold, zinc and aluminum.

13. A composition for forming a surface layer on an electronic device, the composition comprising:
a polymer binder precursor comprising a mixture of i) a polyether-modified acrylate oligomer, ii) a polyester acrylic resin, iii) a component selected from the group consisting of a silicone acrylate oligomer, a fluorinated acrylate oligomer and mixture thereof, and iv) a photoinitiator;
a substituted or unsubstituted hexahydrotriazine compound having a general formula I:

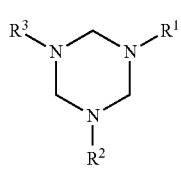

(I)

where $R^1$, $R^2$ and $R^3$ are independently selected from the group consisting of a hydrogen radical, alkyl group, aryl group, or —ROH, where R is an alkyl group; and
optionally at least one solvent,
wherein the substituted or unsubstituted hexahydrotriazine compound is present in an amount of from about 0.01 to about 20 weight percent, based on the total weight of solids in the composition; and the polymer binder precursor is present in an amount of from about 80 to about 99.99 weight percent, based on the total weight of solids in the composition.

14. The composition of claim 13, wherein the substituted or unsubstituted hexahydrotriazine compound is selected from the group consisting of 1,3,5-trimethyl-hexahydro-1,3,5-triazine, 1,3,5-tri(tert-butyl)-hexahydro-1,3,5-triazine, 1,3,5-tri(2-hydroxylethyl)-hexahydro-1,3,5-triazine, 1,3,5-triethyl-hexahydro-1,3,5-triazine, 1,3,5-tribenzyl-hexahydro-1,3,5-triazine and mixtures thereof.

15. The composition of claim 13, wherein the composition does not contain a solvent.

16. The composition of claim 13, wherein the surface layer comprises one or more optional ingredients selected from the group consisting of a diacrylate reactive component, an amine synergist, a surface leveling agent, a catalyst and combinations thereof.

17. A composition for forming a surface layer on an electronic device, the composition comprising:
a polymer binder precursor comprising a substance selected form the group consisting of i) a mixture of polyacrylates and isocyanates; ii) a phenolic resin, an iii) aminoplast resin, and combinations thereof;
a substituted or unsubstituted hexahydrotriazine compound having a general formula I:

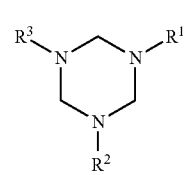

(I)

where $R^1$, $R^2$ and $R^3$ are independently selected from the group consisting of a hydrogen radical, alkyl group, aryl group, or —ROH, where R is an alkyl group; and
optionally at least one solvent,
wherein the substituted or unsubstituted hexahydrotriazine compound is present in an amount of from about 0.01 to about 20 weight percent, based on the total weight of solids in the composition; and the polymer binder precursor is present in an amount of from about 80 to about 99.99 weight percent, based on the total weight of solids in the composition.

18. The composition of claim 17, wherein the substituted or unsubstituted hexahydrotriazine compound is selected from the group consisting of 1,3,5-trimethyl-hexahydro-1,3,5-triazine, 1,3,5-tri(tert-butyl)-hexahydro-1,3,5-triazine, 1,3,5-tri(2-hydroxylethyl)-hexahydro-1,3,5-triazine, 1,3,5-triethyl-hexahydro-1,3,5-triazine, 1,3,5-tribenzyl-hexahydro-1,3,5-triazine and mixtures thereof.

* * * * *